United States Patent [19]
Sawai

[11] Patent Number: 4,849,982
[45] Date of Patent: * Jul. 18, 1989

[54] SEMICONDUCTOR LASER CHIP HAVING A LAYER STRUCTURE TO REDUCE THE PROBABILITY OF AN UNGROWN REGION

[75] Inventor: Masaaki Sawai, Takasaki, Japan

[73] Assignee: Hitachi, Ltd., Tokyo, Japan

[*] Notice: The portion of the term of this patent subsequent to Mar. 15, 2005 has been disclaimed.

[21] Appl. No.: 98,198

[22] Filed: Sep. 17, 1987

Related U.S. Application Data

[63] Continuation of Ser. No. 712,028, Mar. 15, 1985, Pat. No. 4,731,790.

[30] Foreign Application Priority Data

Mar. 16, 1984 [JP] Japan ................................ 59-49033
Mar. 19, 1984 [JP] Japan ................................ 59-50929

[51] Int. Cl.⁴ .............................................. H01S 3/096
[52] U.S. Cl. ..................................................... 372/46
[58] Field of Search .............................. 372/44, 45, 46

[56] References Cited

U.S. PATENT DOCUMENTS

| | | | |
|---|---|---|---|
| 4,161,701 | 7/1979 | Takeda et al. | 372/36 |
| 4,210,878 | 7/1980 | Yonezu | 372/49 |
| 4,349,905 | 9/1982 | Ackley | 372/46 |
| 4,426,700 | 1/1984 | Hirao et al. | 372/45 |
| 4,525,841 | 6/1985 | Kitamura et al. | 372/46 |
| 4,546,479 | 10/1985 | Ishikawa et al. | 372/45 |

FOREIGN PATENT DOCUMENTS

| | | |
|---|---|---|
| 0083697 | 7/1983 | European Pat. Off. . |
| 3036431 | 4/1981 | Fed. Rep. of Germany . |
| 2507357 | 8/1983 | Fed. Rep. of Germany . |

*Primary Examiner*—James W. Davie
*Attorney, Agent, or Firm*—Antonelli, Terry & Wands

[57] ABSTRACT

A semiconductor laser chip having a buried heterostructure comprising a semiconductor substrate and a light emitting portion wherein the active layer and buried layers of the light emitting portion are disposed to be on only a portion of the semiconductor substrate. By virture of this arrangement, the probability of occurrence of $V_{TH}$ effects can be reduced. Also, the occurrence of the junction short-circuits resulting from an overhanging electrode or from deposition of foreign matter can be reduced.

9 Claims, 4 Drawing Sheets

SEMICONDUCTOR LASER CHIP HAVING A LAYER STRUCTURE TO REDUCE THE PROBABILITY OF AN UNGROWN REGION

This is a continuation of application Ser. No. 712,028, filed Mar. 15, 1985, U.S. Pat. No. 4,731,790.

BACKGROUND OF THE INVENTION

This invention relates to a semiconductor laser chip and more particularly to a semiconductor laser chip having a buried heterostructure (BH structure).

Semiconductor laser chips having a variety of structures have been developed as one of the light sources for optical communication or for data processing units such as digital audio discs and the like. (Refer, for example, to "Nikkei Electronics", Sept. 14, 1981, pp. 138–151, published by Nikkei-McGrawHill.)

The Applicant of the present invention has developed a BH semiconductor laser chip as a semiconductor laser chip for optical communication and data processing, as described, for example, in "Hitachi Review", published by Hitachi Hyoron-Sha, Vol. 65, No. 10 (1983), pp. 39–48.

A semiconductor laser chip is constituted by a compound semiconductor of an InGaAsP system when used as a semiconductor laser chip for the optical communication, and by a compound semiconductor of a GaAlAs system when used for data processing. The laser chips of both the InGaAsP system and the GaAlAs system have closely analogous structures.

Here, a semiconductor laser chip for an InGaAsP system developed by the present Applicant prior to the present invention will be described briefly in order to assist in understanding the present invention. This earlier laser chip has a structure such as shown in FIG. 1. The laser chip is produced in the following manner. First of all, a substrate 1 made of n-type In (indium) - P (phosphorus) is prepared. The main plane (upper surface) of the substrate 1 is a (100) crystal plane. A buffer layer 2 consisting of n-type InP, an active layer 3 consisting of InGa (gallium)-As(arsenic), a cladding layer 4 consisting of p-type InP and a cap layer 5 consisting of p-type InGaAsP are sequentially formed on this (100) crystal plane by the liquid epitaxial method. Thereafter, this multi-layered grown layer is partly etched by a solution such as bromomethanol, forming strips 5 to 6 $\mu$m wide. This striped portion is formed so as to extend in the <110> direction of the crystal (perpendicular to the (110) cleavage of the crystal), so that the portion ranging from the active layer 3, and the cladding layer 4 to the cap layer 5 forms an inverted triangle, i.e. the so-called "inverted mesa structure". The side surface of this inverted mesa structure, which will be hereinafter called the "inverted mesa plane" for the sake of convenience, is the (111) crystal plane, on which In appears. The width of the active layer 3 is determined solely by the depth from the surface of the crystal to the active layer 3 and by the width of an insulating layer mask which is disposed on the cap layer 5 during etching, but does not depend upon the etching condition. Therefore, it can be readily reproduced. The portion below the inverted mesa plane portion is a forward mesa structure, which describes gentle curves.

A blocking layer 6 consisting of p-type InP, a buried layer 7 consisting of n-type InP and a cap layer 8 consisting of n-type InGaAsP are formed at the portion which is recessed by etching. A Zn diffusion region 9 reaching the intermediate depth of the cladding layer 4 is formed on the surface of the mesa portion. An insulating film 10 is deposited on the main surface of the substrate 1 except for the electrode contact portions. An anode 11 consisting of an Au-type electrode is disposed on this insulating film 10 and the mesa portion. A cathode 12 consisting of the Au-type electrode 12 is disposed on the reverse side of the substrate 1.

An external force is applied by a diamond tool or the like to one end portion of the substrate 1 to form cleavage scratches with predetermined spaces between them along the cleavage plane of the crystal. Thereafter, bending stress is externally applied to the wafer to effect cleavage, and rectangular slices are formed. Each rectangular slice is scribed with a diamond tool or the like at predetermined intervals in a direction crossing the cleavage line at right angles, and the slices are cracked along the scribed lines, thereby providing a large number of laser chips.

A typical laser chip constructed in this fashion is 400 $\mu$m wide, 300 $\mu$m long and 100 $\mu$m deep. When a predetermined voltage is applied across the anode 11 and the cathode 12, laser light is emitted from the edge surface (mirror surface) of the active layer which is 300 $\mu$m long. This laser chip is used after being fixed to a support via the anode 11 or the cathode 12.

However, a laser chip of the kind described above often fails to emit the laser light and suffers from characteristic defects due to increased threshold current. As a result of studies, the inventor of this invention has found that one of the causes is the insufficient growth of the buried grown layer.

As shown in FIG. 2 (which is an enlarged sectional view showing schematically the part of the principal portion of the semiconductor laser chip shown in FIG. 1), a forward current ($I_F$) flows, in principle, sequentially through the cladding layer 4, the active layer 3 and the buffer layer 2. In a defective laser chip in which the non-emission of the laser light and the increase in the threshold current such as described above occur, it has been found that a leakage current ($I_L$) flows sequentially through the cladding layer 4, the buried layer 7, the ungrown region 13 in the blocking layer 6 (buried layer) and the buffer layer 2. Therefore, the forward current ($I_F$) becomes the sum of the leakage current ($I_L$) and a practical operating current ($I_d$) that flows sequentially through the cladding layer 4, the active layer 3 and the buffer layer 2.

As a result, the threshold current value ($I_{th}$) in the laser chip becomes excessively great or the operating current $I_d$ becomes excessively small because the leakage current becomes excessively great, so that laser oscillation does not occur. Such a laser chip is likely to cause screening problems and there are production problems as well. It has been found that the occurrence of an ungrown region in the blocking layer 6 develops because surface cleaning such as cleaning after etching is inadequate, and the buried layer (blocking layer 6) does not grow at this cleaning defect portion or the portion on which foreign matter has been deposited; consequently, an ungrown region 13 develops.

Another cause for defects will now be considered.

In the manufacture of laser chips, the wafer is cut in a grid pattern to obtain individual chips. At this time, fine cracks occur and foreign matter in the form of very fine impurities is likely to be deposited on the chip in such a manner as to bridge the p-n junction of the semiconductor laser chip. Since this foreign matter 17 is electrically conductive, it causes short-circuits, as shown in FIG. 1. Moreover, since the electrode material 11, 12 of this laser chip is gold (Au), therefore highly malleable, it cannot be cut without some stretching. Therefore, the electrode material is elongated when the wafer is cut off, and overhangs from the periphery of the laser chip, eventually causing a short-circuit.

The active layer portions forming the p-n junction and the boundary portion between the buffer layer 2 and the blocking layer 6 in this laser chip may be as shallow as 3 to 5 $\mu$m, this being the distance from the main plane of the laser chip, and are exposed to the peripheral surface of the laser chip. As a result, the overhanging electrode material 18 is likely to bring the p-type region into contact with the n-type region, so that a short-circuit occurs and the withstand voltage drops.

If the deposition of foreign matter and the overhanging electrode material are found at inspection, the product is rejected. However, these problems sometimes do not occur until after inspection even though they are close to the p-n junction; consequently, defective chips may pass inspection. However, the foreign matter and the overhanging electrode material will become attached to the p-n junction portion eventually when the product is used in a working environment with a consequent malfunction of the chip.

The present invention aims to eliminate these problems of the prior art.

SUMMARY OF THE INVENTION

Among the inventions disclosed herein, the following will briefly illustrate a typical example.

The BH semiconductor laser chip in accordance with the present invention reduces the probability of occurrence of an ungrown region inside the buried layer by reducing the length of each of the buried layer portions extending on both sides of the active layer such as the blocking layer, the buried layer and the cap layer to such an extent that the characteristics of the laser chip do not deteriorate, thereby reducing the planar area of the buried layer, as viewed from the surface of the laser chip, to about ¼ of the area of conventional laser chips. This arrangement can reduce the occurrence of defective characteristics caused by an ungrown region, can produce high performance semiconductor laser chips with a high production yield, and can reduce the cost of production.

The adverse effect of the deposition of foreign matter and of the overhanging electrode material around the periphery of the laser chip can also be prevented by employing the following arrangement for the laser chip having the structure described above.

In a BH semiconductor laser chip in accordance with the present invention, the buried layer portion on the remote side from the active layer such as the blocking layer, the buried layer and the cap layer, and the substrate surface layer portion corresponding to these layers, are removed to such an extent that the characteristics of the laser chip do not deteriorate, in order to reduce the width of the buried layer. At the same time, their surface portions are covered with an insulating film so that the length of the p-n junction exposed on the peripheral surface of the laser chip and therefore the probability of the deposition of the foreign matter are reduced, thereby decreasing the possibility of short-circuits. Moreover, the periphery of each electrode disposed on the insulating film covering the buried layer as well as the substrate is positioned further inward than the periphery of the insulating film so that the characteristics of the laser chip do not deteriorate, in order to prevent the electrode from overhanging the periphery of the laser chip, to prevent short-circuits, to improve reliability and yield, and to reduce the cost of production. It is noted that details of the recessed electrode structure are provided in U.S. Ser. No. 712,029, filed on even date herewith, of Masaaki Sawai et al, U.S. Pat. No. 4,692,927, entitled "Light Emitting Device", which is hereby incorporated by reference.

DESCRIPTION OF THE PREFERRED EMBODIMENTS

EMBODIMENT 1

The present invention is directed to provide a highly reliable semiconductor laser chip. The characterizing features of the invention to accomplish this object will be described more definitely with reference to FIGS. 3 through 7.

Figure 3:
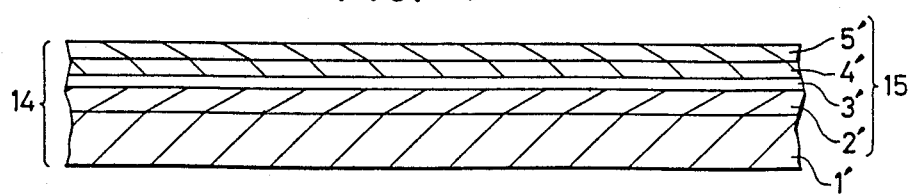
FIG. 3 is a sectional view of a wafer when a multi-layered epitaxial grown layer is formed in the production process of a BH semiconductor laser chip in a first embodiment of the invention.
Figure 4:
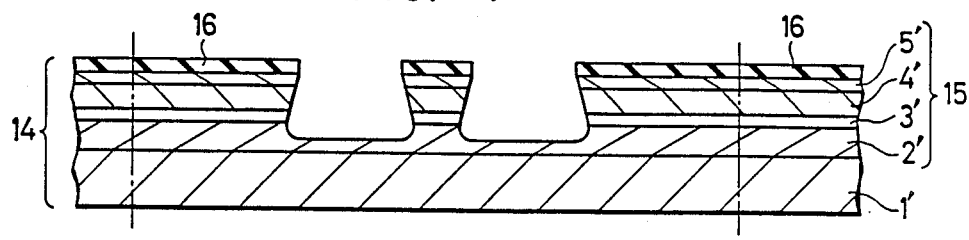
FIG. 4 is a sectional view of the wafer after mesa etching.
Figure 5:
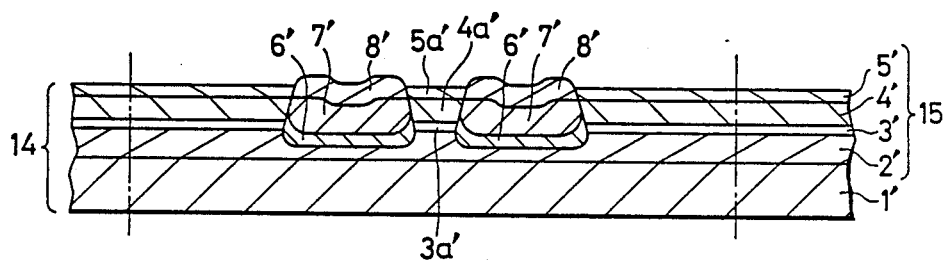
FIG. 5 is a sectional view of the wafer after the burying and growing process has been completed.
Figure 6:
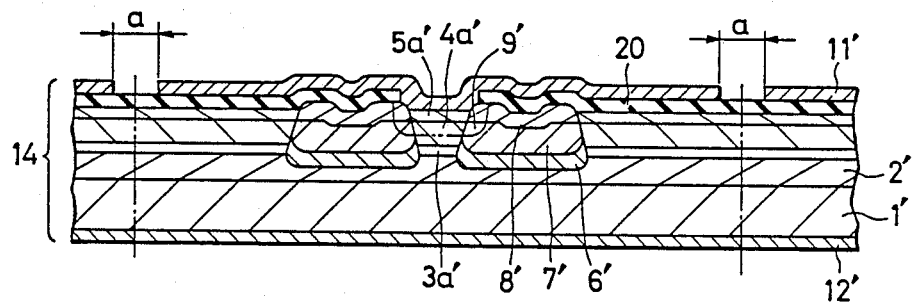
FIG. 6 is a sectional view of the wafer after the process of forming electrodes and an insulating film has been completed.
Figure 7:
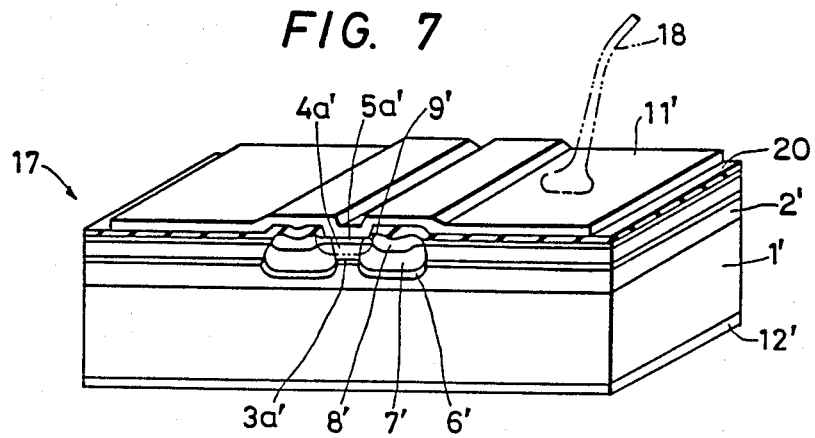
FIG. 7 is a perspective view showing the BH semiconductor laser chip in the completed state.

FIGS. 3 through 7 are sectional views showing the wafer at each production step of the BH semiconductor laser chip in accordance with the first embodiment of the present invention. FIG. 3 is a sectional view of the wafer, FIG. 4 is a sectional view of the wafer after mesa etching has been applied thereto, FIG. 5 is a sectional view of the wafer after the burying and growing step has been applied thereto, FIG. 6 is a sectional view of the wafer after the step of forming an insulating film and electrodes has been completed, and FIG. 7 is a perspective view of the BH semiconductor laser chip in the completed state.

The BH semiconductor laser chip, hereinafter called also the "laser chip", in this embodiment is obtained in the form of the laser chip shown in FIG. 7 after various treatments are sequentially conducted for a compound semiconductor wafer as shown in FIGS. 3 through 6.

First of all, a compound semiconductor substrate 1' is prepared, as shown in FIG. 3. The substrate 1' consists of n-type InP. An n-type InP buffer layer 2', an InGaAsP active layer 3', a p-type InP cladding layer 4 and a p-type InGaAsP cap layer 5 are sequentially formed on the (100) crystal plane of this substrate 1 by the liquid epitaxial method. In the present specification, the resulting epitaxially laminate grown layer will be called a "multi-layered grown layer 15". The buffer layer 2', the active layer 3' and the cladding layer 4' constitute a double heterojunction structure. The heterojunctions are formed at the boundary between the active layer 3' and the buffer layer 2' and between the active layer 3' and the cladding layer 4'. The substrate 1' is about 200 $\mu$m thick, the active layer 3' (3a') is 0.15 $\mu$m thick and the other layers are 1 to 2 $\mu$m thick. In this specification, the laminate consisting of the substrate 1', the buffer layer 2', the active layer 3' and the cladding layer 4' will be called merely a "wafer (14)".

Next, an insulating film (SiO$_2$ film) is formed on the main plane (upper surface) of the wafer 14 by CVD (chemical vapor deposition) as shown in FIG. 4, and parts of this insulating film are removed by photolithography in belts that extend parallel to one another in the direction of the <110> axis. The width of each removed area is about 50 $\mu$m, and the spacing between the removed portions is 5 to 6 $\mu$m. The insulating film remains unremoved on the portions of the other main plane of the wafer, and an etching mask 16 is formed. This mask pattern is repeatedly formed in the transverse direction. The semiconductor layer exposed from this mask 16 of the wafer 14 is etched by a solution such as bromomethanol. Etching is effected to the intermediate depth of the buffer layer 2' or the surface layer portion of the substrate 1'. In this embodiment, etching reaches the intermediate depth of the buffer layer 2'.

Since the etching described above is anisotropic etching, the etched surfaces on both sides are gently inclined or curved in the desired direction, respectively. The upper portion above the active layer 3 covered with the 5 to 6 $\mu$m mask 16 at the center becomes an inverted mesa portion with a cross-section which describes an inverted truncated triangle. It remains in the striped forming the <110> direction of the crystal. The portions below the active layer form a forward mesa portion. The spacing between each unit mask pattern is about 400 $\mu$m.

Next, the mask 16 that extends partially on the main plane of the wafer 14 is removed. Thereafter, a p-type InP blocking layer 6', an n-type InP buried layer 7' and an n-type InGaAsP cap layer 8' are sequentially buried by the epitaxial method into the portion which is recessed by etching, as shown in FIG. 5. These three layers will be hereinafter referred to as a "buried layer".

As this buried layer is formed, a real active layer 3a' that emits light, a real cladding layer 4a' and a real cap layer 5a' are formed.

Since the portion consisting of the buffer layer 2', the active layer 3a', the cladding layer 4a', the cap layer 5a', the blocking layer 6' and the buried layer 7' is the portion that is necessary for emitting light, and this portion will be hereinafter called the "light emitting portion".

Next, an insulating film 20 consisting of SiO$_2$ or the like is formed on the entire region of the main plane of the wafer 14 as shown in FIG. 6. The portion of this insulating film 20 that corresponds to the center cap layer 5a' is removed by photolithography. Zinc (Zn) is introduced into the main plane of the wafer 14 using the insulating film 20 as the mask, thereby forming a Zn diffusion region 9' that reaches the intermediate depth of the cladding layer 4a'. This Zn diffusion region 9' serves as an ohmic contact layer for a contact electrode.

An anode 11' is disposed on the main plane of the wafer 14, and a cathode 12, on its reverse. The anode 11' is made of Cr/Au while the cathode 12' is made of Au/Sn. Each electrode is formed by being heat treated (alloying treatment) after being vacuum deposited on the wafer. Though the cathode 12' is formed on the entire region of the reverse of the wafer, the anode 11' is not disposed in the scribed area having a width a with the one-dot-chain line being the center, as shown in FIGS. 6 and 7. The reverse of the wafer 14 is etched before the cathode 12' is formed thereon, and the total thickness of the wafer 14 is about 100 $\mu$m. The one-dot-chain line in FIGS. 4 through 6 represents the edge of the chip pattern in the transverse direction, and the chips are cut off at this portion when the wafer is cut.

Figure 8:
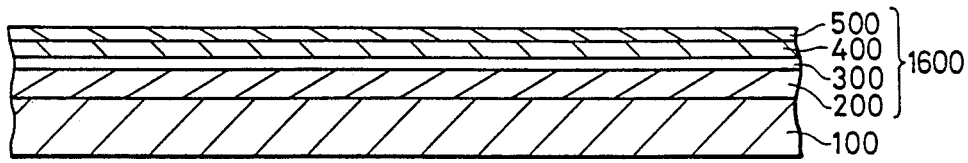
FIG. 8 is a sectional view of the wafer in the state in which the multi-layered epitaxially grown layer is formed in the production process of a semiconductor BH laser chip in accordance with a second embodiment of the present invention.

Next, an external force is applied to one end of the wafer 14 using a diamond tool or the like, in order to cause equidistant cleavage scratches along the cleavage plane of the crystal. Thereafter, bending stress is externally applied to the wafer 14 to cause cleavage, and rectangular slices are formed. Next, scribes are equidistantly applied to the scribed area of the slices in a direction crossing at right angles the cleavage line using a diamond tool or the like, and the slices are cut off by cracking along the scribe, providing a large number of laser chips 17. The appearance of the laser chip 17 is shown in FIG. 7. Its dimensions are 400 $\mu$m wide, 300 $\mu$m long and 100 $\mu$m high, for example. When a predetermined voltage is applied across the anode electrode 11 and the cathode electrode 12, the laser chip emits oscillating laser light from the 300 $\mu$m long edge surface of the active layer, i.e. the mirror surface. This laser chip 17 is fixed to a support via the anode 11 or the cathode 12 in practice. When the laser chip 17 is soldered to a support of a high heat conductive SiC ceramic, having thermal conductivity of 2.5 W/deg. cm, for example, the surface on the side of the cathode 12' can be used as the fixing surface. A wire 18 is connected to the anode 11' disposed on the main plane of the substrate 1 which is away from the buried layer consisting of the blocking layer 6', the buried layer 7' and the cap layer 8', as shown in FIG. 8. As a result, the impact at the time of wire bonding is applied to the portion of the substrate 1' which has little effect on the characteristics of the chip, and does not affect the active region causing laser oscillation (the region in which the active layer 3a', the blocking layer 6' and the like exist). Therefore, deterioration of the laser chip characteristics due to wire bonding can be prevented.

The semiconductor laser chip in this embodiment provides the following effects.

(1) In the semiconductor laser chip of this invention, the area of the region of the buried layer with respect to the chip area is reduced to about ¼ of the area of the prior art chips. Therefore, the frequency of occurrence of the ungrown layer, which is likely to develop in the buried layer, and particularly in the blocking layer 6', can be reduced to about ¼ of that of the prior art, and leakage current which occurs due to the existence of the ungrown region and which flows through the ungrown region can be prevented. Thus, the characteristic defects resulting from nonoscillation and from increased threshold current can be reduced, and the reliability and production yield of laser chips can be improved.

(2) In the semiconductor laser chip of the present invention, the wire connection portion is disposed above the substrate where laser oscillation is not effected. Therefore, since the characteristics of the chip do not deteriorate even with wire bonding, both product quality and production yield can be improved.

(3) When producing the laser chip of the present invention, the conventional production process can be employed as such merely by changing the mask pattern. Therefore, the cost of production remains unchanged even though the structure of the laser chip is changed.

(4) The advantages described in items (1) through (3) described above can improve production yield and reliability of semiconductor laser chips during the production thereof, so that the cost of production can be reduced.

Embodiment 2

Figure 9:
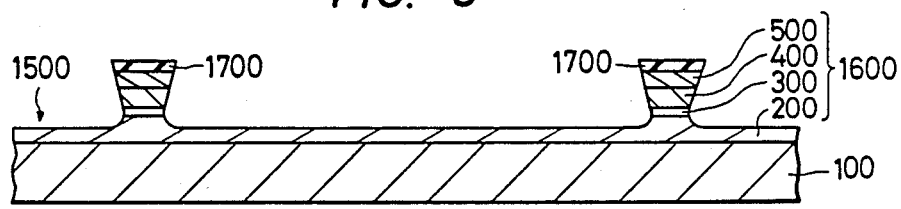
FIG. 9 is a sectional view of the wafer after mesa etching.
Figure 10:
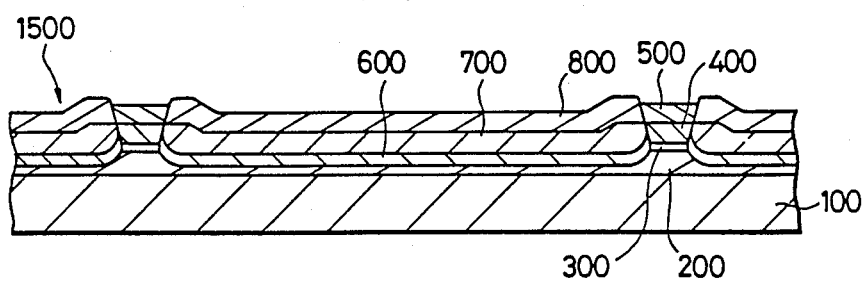
FIG. 10 is a sectional view of the wafer after the burying and growing process has been completed.
Figure 11:
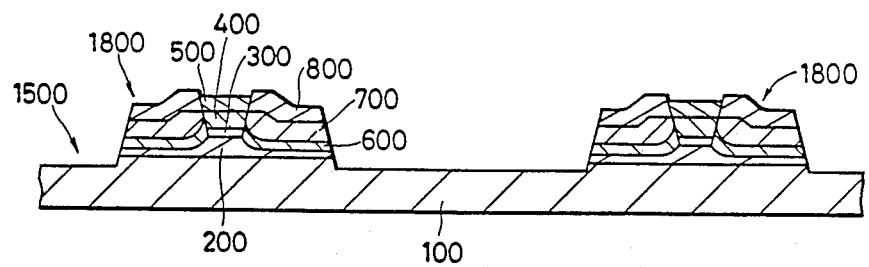
FIG. 11 is a sectional view of the wafer after a part of the buried grown layer has been removed.
Figure 12:
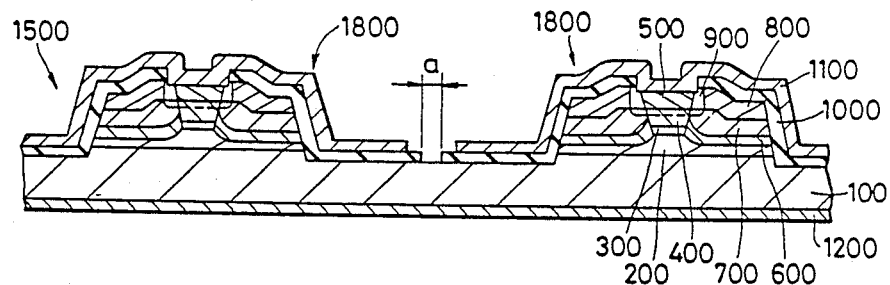
FIG. 12 is a sectional view of the wafer after the process for forming the insulating film and the electrodes has been completed.
Figure 13:
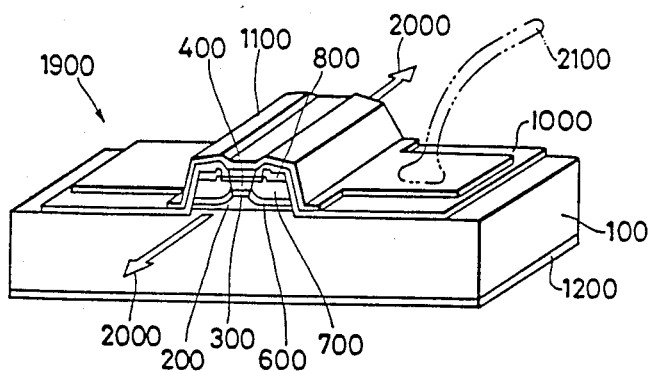
FIG. 13 is a perspective view showing a BH semiconductor laser chip in the completed state.

FIGS. 8 through 13 are sectional views of a BH semiconductor laser chip of the second embodiment of the invention in its production process. FIG. 8 is a sectional view of the wafer after the multi-layered grown layer is formed, FIG. 9 is a sectional view of the wafer after mesa etching has been applied, FIG. 10 is a sectional view of the wafer after the burying and growing treatment has been completed, FIG. 11 is a sectional view of the wafer after the process of partially removing the buried grown layer has been completed, FIG. 12 is a sectional view after the process for forming the insulating film and electrodes has been completed, and FIG. 13 is a perspective view of the BH semiconductor laser chip in the completed state.

The BH semiconductor laser chip (which will hereinafter be called merely the "laser chip") is obtained in the form of the semiconductor laser chip such as shown in FIG. 13 after various treatments are sequentially applied to a compound semiconductor substrate shown in FIGS. 8 through 12.

First, a compound semiconductor substrate 100 is prepared, as shown in FIG. 8. A multi-layered grown layer 1600 consisting of an n-type InP buffer layer 200, an InGaAsP active layer 300, a p-type InP cladding layer 400 and a p-type InGaAsP cap layer 500 is formed on the (100) crystal plane of the substrate 100 by a liquid epitaxial method. The buffer layer 200, the active layer 300 and the cladding layer 400 from a double heterostructure. The substrate 100 is about 200 μm thick, the active layer is 0.15 μm thick, and the other layers are 1 to 2 μm thick.

Next, an insulating film (SiO$_2$) is formed on the main plane (upper surface) of the wafer 1500 by chemical vapor deposition (CVD) as shown in FIG. 9. The insulating film is partially removed by photolithography, providing a large number of striped masks 1700 which are 5 to 6 μm wide and extend parallel to the <110> cleavage direction. Thereafter, the semiconductor layer exposed from the mask 1700 of this wafer 1500 is etched by a solution such as bromomethanol. Etching continues till it reaches the intermediate depth of the buffer layer 200, or the surface layer portion of the substrate 100. In this embodiment, etching reaches the intermediate depth of the buffer layer 200. As a result of anisotropic etching, the upper portion of the active layer covered with the mask 1700 is an inverted mesa portion with its cross-section being an inverted, truncated triangle, and remains in the striped form in the direction of the <110> plane of the crystal. The lower portion of the active layer 300 is a forward mesa portion describing curves. The mask spacing is about 400 μm.

Next, the masks 1700 extending partially on the main plane of the wafer 1500 are removed. Then, a p-type blocking layer 600, an n-type InP buried layer 700 and an n-type InGaAsP cap layer 800 are sequentially buried in the portion that is recessed by etching by the epitaxial method. These three layers in combination will be referred to as the "buried layer".

The portion of the buried layer away from the active layer, that is, the intermediate portion of the active layers 300 between two laser chips, is removed by photolithography as shown in FIG. 11, and a mesa portion 1800 is formed having a width of, say, 100 μm, with the inverted mesa portion being the center. In order to completely remove the buried layer portion, removal is effected up to the surface layer portion of the substrate 100. This process provides the portion necessary for emitting the light (or the aforementioned light emitting portion) on the semiconductor substrate.

An insulating film 1000 consisting of SiO$_2$ or the like is partially formed on the main plane of the wafer 100. Therefore, the ends of p-n junctions exposed to the side surfaces are covered with this insulating film 1000. This insulating film 1000 is not disposed in the cut-off region (scribed area represented by a width a) in the direction crossing at right angles the cleavage plane of the wafer 1500 or on the surface layer portion of the inverted mesa portion.

Next, zinc (Zn) is introduced into the main plane of the wafer 1500 using the insulating film 1000 as the mask, and a Zn diffusion region 900 reaching the intermediate depth of the cladding layer 400 is formed. This Zn diffusion region 900 serves as an ohmic layer of a contact electrode. An anode 1100 is disposed on the main plane of the wafer 1500 and a cathode 1200, on its reverse, respectively.

Though the cathode 1200 is disposed over the entire area of the reverse of the wafer 1200, the anode 1100 is not. Instead, it is disposed to be recessed from the periphery of the substrate except for the entire region of the mesa portion 1800 and the peripheral portion of the insulating film 1000 directly placed on the substrate 100 (the region which is dozens of μm wide from the periphery of the insulating film but exclusive of the portion close to the mesa portion 1800). In other words, the anode 1100, too, is disposed in the form of a striped pattern having equidistantly contracted portions on the main plane of the wafer 1500. The direction of a line connecting these contracted portions becomes the cleavage plane. Incidentally, the reverse of the wafer 1500 is etched before the cathode 1200 is formed thereon, and the total thickness of the wafer 1500 is about 100 μm.

Next, an external force is applied to one edge portion of the wafer 1500 by a diamond tool or the like, and cleavage scratches are formed equidistantly along the cleavage plane of the crystal. Thereafter, bending stress is externally applied to the wafer 1500 to cause cleavage, forming rectangular slices. The scribed areas of the slices are then equidistantly scribed in a direction crossing the cleavage line at right angles, and the slices are cut off by cracking along the scribed lines, thereby forming a large number of laser chips. The appearance of the laser chip 1900 is shown in FIG. 13. It is 400 μm long, 300 μm wide and 100 μm deep in this example. When a predetermined voltage is applied across the anode 1100 and the cathode 1200, the edge surface of the 300 μm long active layer (mirror surface) emits oscillating laser light 2000. This laser chip 1900 is in practice fixed to a support via the anode 1100 or the cathode 1200.

When, for example, the laser chip 1900 is soldered to a support consisting of a high heat conductive SiC ceramic (thermal conductive: 25 W/deg. cm), the surface of the cathode electrode 1200 can be used as the fixing surface, and the wire 2100 can be connected to the anode 1100 portion which is placed directly on the substrate 100. In this case, the impact at the time of wire bonding is applied to the substrate 100 portion where it hardly affects chip characteristics, but not to the active region, the region where the active layer 300, the blocking layer 600 and the like exist, that causes laser oscillation. For this reason, deterioration of laser characteristics due to wire bonding can be prevented.

This embodiment provides the following effects.

Figure 1:
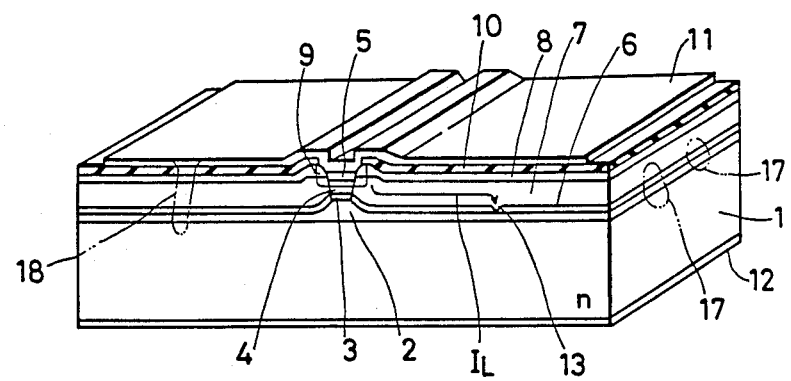
FIG. 1 is a perspective view of a BH semiconductor laser chip developed by the Applicant of the present invention before the present invention.
Figure 2:
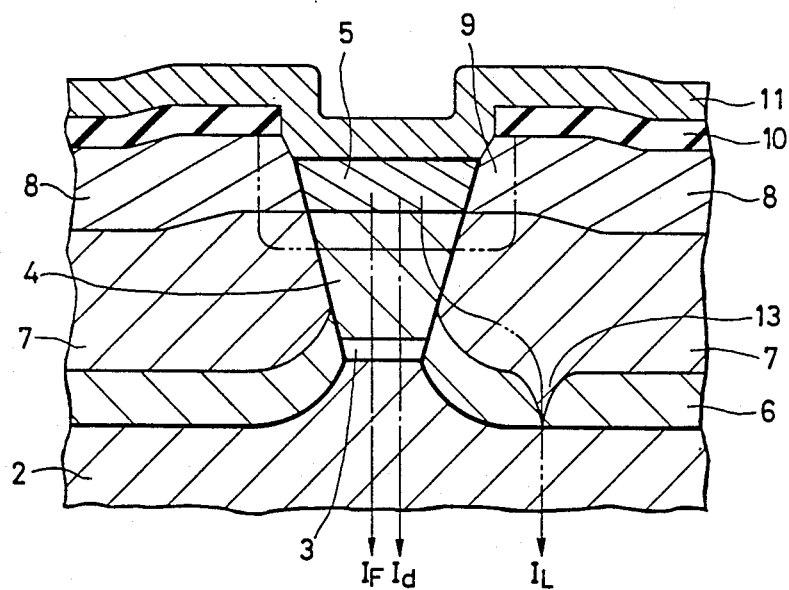
FIG. 2 is a sectional view showing the state of a leakage current in a BH semiconductor laser chip.

(1) In the semiconductor laser chip of the present invention, the length of the p-n junction exposed on the peripheral surface of the chip is reduced to about 1/7 of the length of the p-n junction of the prior art chips. Therefore, the probability of deposition of foreign matter on the p-n junction and the problem of overhanging electrode material 18 shown in FIG. 1 can be drastically reduced, so that the frequency of occurrence of the drop of withstand voltage of the chip and that of short-circuits can be reduced, and the production yield as well as reliability of the chip can be improved.

(2) In the semiconductor laser chip of this invention, most of the peripheral edges of the anode contract inward several μm from the peripheral edge of the insulating film and there is also the characterizing feature that the p-n junction is short as described in item (1) above. Therefore, even if the deposition of foreign matter as well as the overhanging electrode material occur, the drop of the withstand voltage and short circuits are unlikely to occur, and the production yield and reliability of the chip can be consequently improved.

(3) In the semiconductor laser device of this invention, the wire connection portion is disposed above the substrate where laser oscillation is not effected. Therefore, even with wire bonding, the chip characteristics do not deteriorate, the chip is of high quality; hence, production yield can be improved.

(4) Due to the effects (1) through (3) described above, production yield as well as reliability of the chip can be improved with the present invention, so that production costs can be reduced.

Though the present invention has thus been described with reference to the two preferred embodiments thereof, the present invention can of course be changed or modified in various ways without departing from the scope and spirit thereof.

Though the foregoing description deals primarily with the case where the invention is applied to semiconductor laser chip production for optical communication, which is the background of the invention, the invention is not particularly limited thereto, but can be applied, for example, to the production of semiconductor laser chips for data processing.

The present invention can at the least be applied to semiconductor laser chips having buried heterostructure.

I claim:
1. A semiconductor device comprising:
 a compound semiconductor substrate having a first major surface and containing an InP compound semiconductor;
 a light emitting portion formed on said compound semiconductor substrate, said light emitting portion having an active layer made an InGaAsP compound semiconductor serving as a light emitting region, sidewalls, a top surface and a pn junction formed at the surface of said sidewalls, wherein said light emitting portion is disposed to be entirely located within an area which is only over a predetermined portion of said first major surface;
 insulating films formed over said sidewalls to cover said pn junction and formed over a part of said top surface of said light emitting portion; and
 a pair of electrode means for supplying a voltage to forward bias said light emitting portion so that a laser beam is generated from said active layer,
 wherein said light emitting portion includes:
 (a) a first compound semiconductor layer of the first conductivity type coming into contact with said compound semiconductor substrate of the first conductivity type;
 (b) said active layer coming into contact with said first compound semiconductor layer of the first conductivity type;
 (c) a second compound semiconductor layer of a second conductivity type opposite to said first conductivity type, coming into contact with said active layer;
 (d) third compound semiconductor layers of the second conductivity type, formed on said first compound semiconductor layer of the first conductivity type, and interposing therebetween a part of said first compound semiconductor layer of the first conductivity type, said active layer and a part of said second compound semiconductor layer of the second conductivity type; and
 (e) fourth compound semiconductor layers of the first conductivity type, formed on said third compound semiconductor layers of the second conductivity type, and interposing therebetween said second compound semiconductor layer of the second conductivity type.

2. A semiconductor device according to claim 1, wherein each of said first semiconductor layer of the first conductivity type, said second semiconductor layer of the second conductivity type, said third semiconductor layers of the second conductivity type and said fourth semiconductor layers of the first conductivity type is comprised of an InP compound semiconductor.

3. A semiconductor device according to claim 1, wherein said light emitting portion terminates at a position move inward than sidewalls of said semiconductor substrate in a direction substantially at right angles with the emitting direction of the laser beam.

4. A semiconductor device according to claim 1, wherein said first conductivity type is N-type, and said second conductivity type is P-type.

5. A semiconductor device according to claim 1, further comprising a bonding wire connected to one of said electrode means.

6. A semiconductor device comprising:

a compound semiconductor substrate having a first major surface and containing an InP compound semiconductor;

a light emitting portion formed on said compound semiconductor substrate, said light emitting portion having an active layer made of an InGaAsP compound semiconductor serving as a light emitting region, sidewalls, a top surface and a pn junction formed at the surface of said sidewalls, wherein said light emitting portion is disposed to be entirely located within an area which is only over a predetermined portion of said first major surface;

insulating films formed over said sidewalls to cover said pn junction and formed over a part of said top surface of said light emitting portion;

a pair of electrode means for supplying a voltage to forward bias said light emitting portion so that a laser beam is generated from said active layer; and a bonding wire connected to one of said pair of electrode means, wherein said light emitting portion includes:

(a) a first compound semiconductor layer of the first conductivity type coming into contact with said compound semiconductor substrate of the first conductivity type;

(b) said active layer coming into contact with said first compound semiconductor layer of the first conductivity type;

(c) a second compound semiconductor layer of a second conductivity type opposite to said first conductivity type, coming into contact with said active layer;

(d) third compound semiconductor layers of the second conductivity type, formed on said first compound semiconductor layer of the first conductivity type, and interposing therebetween a part of said first compound semiconductor layer of the first conductivity type, said active layer and a part of said second compound semiconductor layer of the second conductivity type; and (e) fourth compound semiconductor layers of the first conductivity type, formed on said third compound semiconductor layers of the second conductivity type, and interposing therebetween said second compound semiconductor layer of the second conductivity type.

7. A compound semiconductor device according to claim 6, wherein each of said first semiconductor layer of the first conductivity type, said second semiconductor layer of the second conductivity type, said third semiconductor layers of he second conductivity type and said fourth semiconductor layers of the first conductivity type is comprised of an InP compound semiconductor.

8. A compound semiconductor device according to claim 6, wherein said light emitting portion terminates at a position more inward than sidewalls of said semiconductor substrate in a direction substantially at right angles with the emitting direction of the laser beam.

9. A compound semiconductor device according to claim 6, wherein said first conductivity type is N-type, and said second conductivity type is P-type.

* * * * *